United States Patent
Paul et al.

(10) Patent No.: US 9,599,691 B2
(45) Date of Patent: Mar. 21, 2017

(54) MAGNETIC RESONANCE APPARATUS AND METHOD FOR RF EXCITATION WITH TWO RESONANCE FREQUENCIES TO DETECT THE CEST EFFECT

(71) Applicant: Siemens Aktiengesellschaft, Munich (DE)

(72) Inventors: Dominik Paul, Bubenreuth (DE); Benjamin Schmitt, Mosman (AU)

(73) Assignee: Siemens Aktiengesellschaft, Munich (DE)

( * ) Notice: Subject to any disclaimer, the term of this patent is extended or adjusted under 35 U.S.C. 154(b) by 464 days.

(21) Appl. No.: 14/272,663

(22) Filed: May 8, 2014

(65) Prior Publication Data
US 2014/0333303 A1    Nov. 13, 2014

(30) Foreign Application Priority Data
May 8, 2013    (DE) .......... 10 2013 208 475

(51) Int. Cl.
*G01V 3/00*       (2006.01)
*G01R 33/56*     (2006.01)
*G01R 33/34*     (2006.01)
*G01R 33/3415*  (2006.01)

(52) U.S. Cl.
CPC ... *G01R 33/5607* (2013.01); *G01R 33/34092* (2013.01); *G01R 33/5605* (2013.01); *G01R 33/3415* (2013.01)

(58) Field of Classification Search
CPC .......... G01R 33/5607; G01R 33/34092; G01R 33/5605; G01R 33/3415
USPC .......................................... 324/309
See application file for complete search history.

(56) References Cited

U.S. PATENT DOCUMENTS

| 7,683,617 B2* | 3/2010 | Van Zijl | G01R 33/485 324/307 |
| 2003/0069495 A1* | 4/2003 | Agrikola | G01R 33/56 600/410 |
| 2003/0102866 A1 | 6/2003 | Katscher et al. | |
| 2008/0200799 A1 | 8/2008 | Willard et al. | |

(Continued)

FOREIGN PATENT DOCUMENTS

| WO | WO-2011/091365 A1 | 7/2011 |
| WO | WO-2012/117350 A1 | 9/2012 |

OTHER PUBLICATIONS

Van Zijl et al., "MRI Detection of Glycogen in vivo by using Chemical Exchange Saturation Transfer Imaging (glycoCEST)", Mar. 13, 2007, The National Academy of Sciences of the USA, vol. 104, No. 11, pp. 4359-4364.*

(Continued)

Primary Examiner — Susan Lee
(74) Attorney, Agent, or Firm — Schiff Hardin LLP

(57) ABSTRACT

In a magnetic resonance apparatus and method for RF excitation with two resonance frequencies to detect the CEST effect, the RF excitation is achieved with the use of a first RF antenna and a second RF antenna of the magnetic resonance apparatus with a first portion of the RF excitation at a first resonance frequency of the two resonance frequencies being implemented with the first RF antenna, and a second portion of the RF excitation at a second resonance frequency of the two resonance frequencies is implemented with the second RF antenna.

15 Claims, 5 Drawing Sheets

(56) References Cited

U.S. PATENT DOCUMENTS

| | | | |
|---|---|---|---|
| 2009/0286478 A1 | 11/2009 | Biber et al. | |
| 2011/0243420 A1* | 10/2011 | Fautz | G01R 33/5612 382/131 |
| 2011/0288402 A1 | 11/2011 | Pikkemaat et al. | |
| 2012/0019245 A1* | 1/2012 | Reddy | G01R 33/5601 324/309 |
| 2013/0009640 A1* | 1/2013 | Fautz | G01R 33/5605 324/309 |
| 2013/0169273 A1 | 7/2013 | Grodzki | |
| 2013/0214782 A1 | 8/2013 | Fautz | |
| 2014/0070803 A1* | 3/2014 | Jin | G01R 33/5605 324/309 |

OTHER PUBLICATIONS

Lee et al.: "Isolating Chemical Exchange Saturation Transfer Contrast from Magnetization Transfer Asymmetry under Two-Frequency RF irradiation", Journal of Magnetic Resonance, vol. 215 (2012), p. 56-63.

Wang et al.; "An Eight-Coil High-Frequency Probehead Design for High-Throughput Nuclear Magnetic Resonance Spectroscopy"; Journal of Magnetic Resonance; vol. 170; (2004) pp. 206-212.

Sun et al; "Simulation and Optimization of Pulsed Radio Frequency Irradiation Scheme for Chemical Exchange Saturation Transfer (CEST) MRI-Demonstration of pH-Weighted Pulsed-Amide Proton CEST MRI in an Animal Model of Acute Cerebral Ischemia"; Magnetic Resonance in Medicine; vol. 66; (2011) pp. 1042-1048.

\* cited by examiner

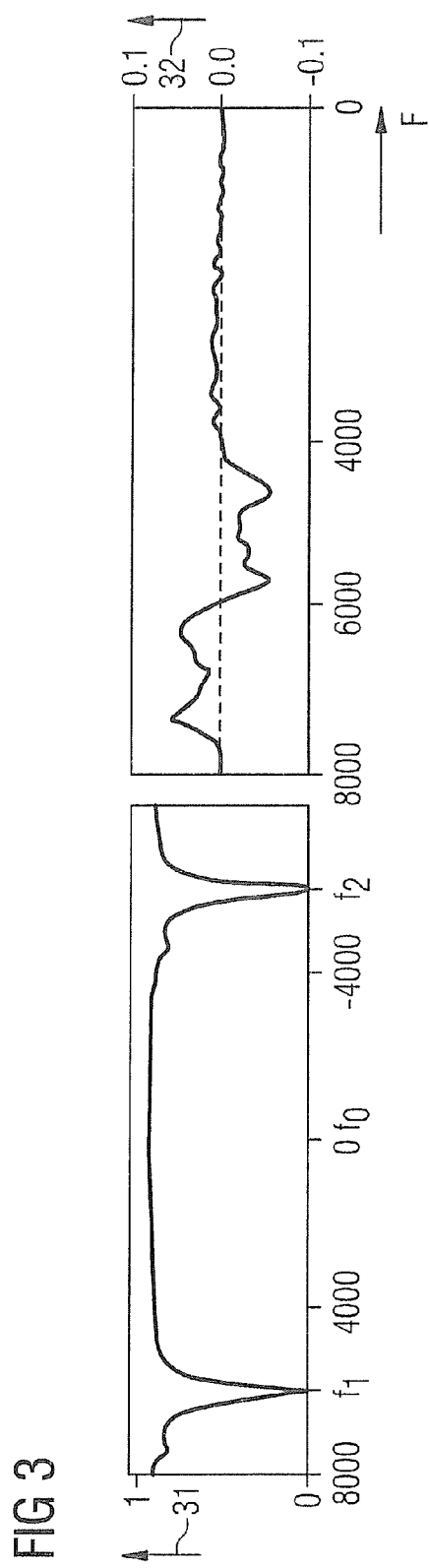

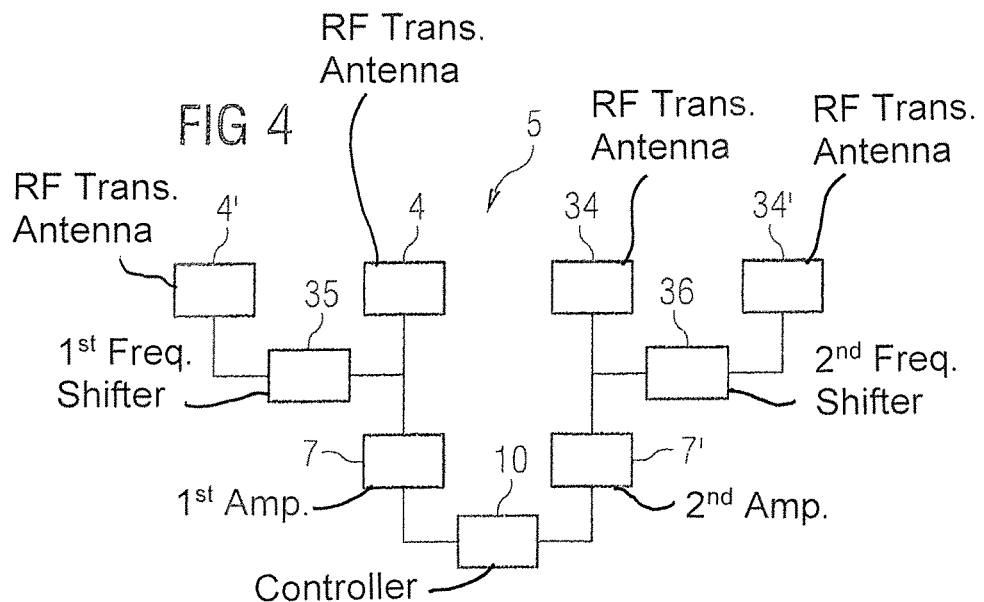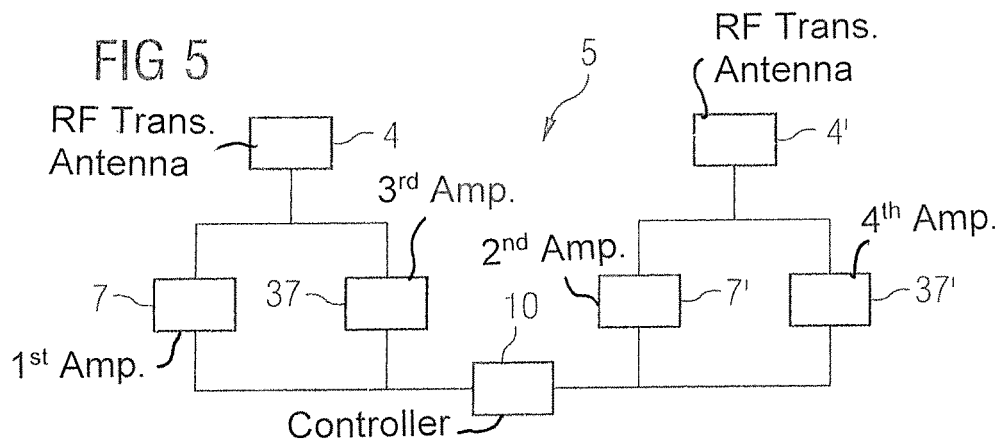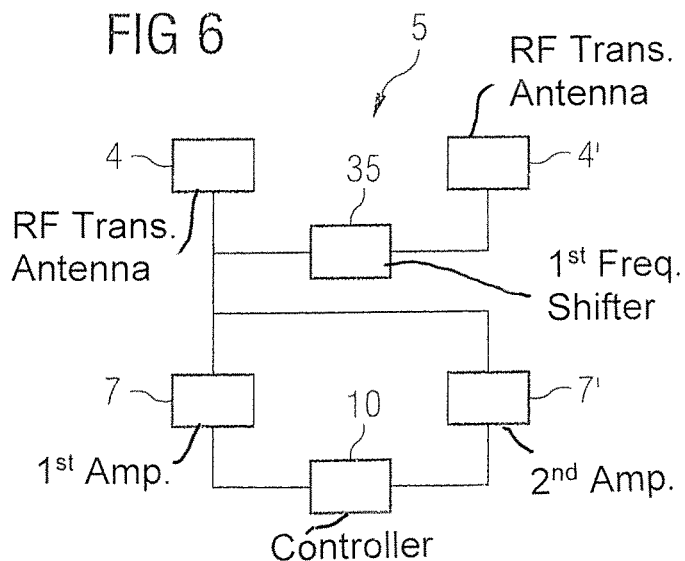

MAGNETIC RESONANCE APPARATUS AND METHOD FOR RF EXCITATION WITH TWO RESONANCE FREQUENCIES TO DETECT THE CEST EFFECT

BACKGROUND OF THE INVENTION

Field of the Invention

The present invention concerns a method in order to implement an RF excitation with two resonance frequencies by operation of a magnetic resonance (MR) system in order to detect or, to quantify the CEST (Chemical Exchange Saturation Transfer) effect.

Description of the Prior Art

In MR imaging, the CEST effect is utilized in order to indirectly detect specific substances (for example creatine, glycogen, glutamate). Use of the CEST effect makes it possible to better assess and evaluate the quality of cartilage of a human examination subject, for example, than is possible via other methods for MR imaging.

The transfer of magnetization via chemical exchange is utilized in CEST. The resonance signals of labile protons, which are bound in molecules of the substance to be detected, are saturated in order to detect these protons when they are subsequently bound to water molecules to which they have been transferred via chemical exchange.

However, conventional magnetization transfer (MT), in which two different sets of spins exchange their magnetization (more precisely their magnetic polarization), still exists in addition to CEST. In the field of MR imaging, MT is a magnetization transfer in which one of the two sets of spins represents water (more precisely water protons), which is present in large quantities in tissue and organs in the human body. The other set of spins represents protons that are bound in molecules of the substance to be detected.

Since CEST and MT occur simultaneously in human tissues and organs, it is difficult to qualitatively, or better, quantitatively, measure the effects of the CEST effect alone (i.e. without influence of MT).

SUMMARY OF THE INVENTION

An object of the present invention poses is to measure the effects of the CEST effect alone qualitatively, and primarily quantitatively, and to provide a tool in order to accomplish this.

Within the scope of the present invention, a method is provided for RF excitation with two resonance frequencies to detect the CEST effect in the operation of a magnetic resonance system. The RF excitation takes place to saturate the resonance signals of those labile protons that are bound to the molecules of the material or substance to be detected, with at least two RF antennas or channels. A first portion of the RF excitation with the first resonance frequency (of the two resonance frequencies) takes place with the first RF antenna (of the at least two RF antennas), and a second portion of the RF excitation with the second resonance frequency (of the two resonance frequencies) takes place with the second RF antenna (of the at least two RF antennas).

Because a respective RF pulse (thus two RF pulses in total) with different resonance frequencies and constant amplitude are radiated or sent via (at least) two RF antennas, it is no longer necessary to implement a complicated amplitude modulation depending on the frequency interval of the two resonance frequencies, as would be necessary for the case if the radiation of the RF excitation were to take place with only one RF antenna. Due to the use of two RF antennas to radiate the RF excitation energy for saturation (in comparison to only one RF antenna), neither a high susceptibility to truncation artifacts or spikes in the spectrum, nor a strong loading of the transmission RF amplifier, nor a limited capability of realizing pulse profiles by the sequence framework, exist. In summary: due to the use of at least two RF antennas or channels according to the invention in comparison to only one RF antenna, a realization of the method according to the invention that is significantly easier in terms of hardware results for RF excitation with two resonance frequencies, in order to separate CEST effects from the MT effects by a double frequency radiation.

The individual radiations of the RF excitation energy for saturation preferably take place simultaneously, such that the first RF antenna with the first resonance frequency operates simultaneously with the second RF antenna with the second resonance frequency.

In other words: two RF excitations are radiated simultaneously by the two RF antennas, with the first RF excitation (the first RF pulse) having the first resonance frequency and the second RF excitation (the second RF pulse) having the second resonance frequency.

Each of the first RF pulse and the second RF pulse can have any of the following shapes:

a rectangular shape (meaning that the curve of the RF pulse corresponds to a rectangle), a Gaussian shape (meaning that the curve of the RF pulse corresponds to the Gaussian bell curve), or a sinc shape (meaning that the curve of the RF pulse corresponds to the sinc function (sinc(x)).

Since each RF antenna according to the invention must generate only one resonance frequency, there is advantageously no need for a particularly high number of node points for the amplitude modulation, which would be necessary given use of only one RF antenna to generate an RF excitation with two resonance frequencies. The two RF pulses can assume one of the shapes described above which, for example, are very well suited to the selective saturation of nuclear spin resonances.

In a preferred embodiment of the invention, the RF excitation additionally takes place with a third RF antenna and fourth RF antenna (channels) of the magnetic resonance system in addition to the first and second RF antennas. During a first time interval of a period duration, in a periodically repeating manner the first part of the RF excitation with the first resonance frequency is thereby radiated first with the use of the first RF antenna, and the second part of the RF excitation with the second resonance frequency is radiated with the aid of the second RF antenna. Directly following this, during a second time interval of the period duration the first part of the RF excitation with the first resonance frequency is radiated with the third RF antenna and the second part of the RF excitation with the second resonance frequency is radiated with the fourth RF antenna.

The first and the second RF antennas do not transmit during the second time interval of each period duration, while the third and fourth RF antennas do not transmit during the first time interval of each period duration.

Because either the first and second RF antennas or the third and fourth RF antenna operate in alternation periodically, an RF excitation of arbitrary time length (duration) (for example on the order of 1 to 3 s) can be achieved, even if each individual antenna or channel is able to continuously emit an RF pulse only of a duration of 100 ms or 500 ms. In spite of a temporal loading of the individual amplifiers of 50%, with this embodiment quasi-continuous RF power of an arbitrary duration can be applied so that the RF excitation can be radiated with two resonance frequencies until a saturation equilibrium occurs, in which the saturation due to the RF excitation and the saturation loss due to chemical exchange balance.

Naturally, according to the invention it is also possible to use more than four RF antennas in order to implement the RF excitation. Because two of these respective RF antennas or channels are active (wherein one of the operating RF antennas radiates with the first resonance frequency and the other of the operating RF antennas radiates with the second resonance frequency) while the remaining RF antennas are inactive, the temporal loading of the respective RF antenna (or of its respective amplifier) can be further reduced although the RF power or the RF excitation is applied quasi-continuously over an arbitrary duration.

By the use of four or more RF antennas or channels according to the invention, and the realization of a quasi-continuous radiation of the RF excitation energy with two frequencies, the CEST effects can be quantified very precisely. In some cases, this procedure according to the invention for the first time enables the quantification of the CEST effect in a magnetic field of 3 Tesla, for example for quantification of glycogens in the liver.

In the present invention, the two resonance frequencies with which the RF excitation operates for saturation are selected depending on the material or the substance that is to be detected or localized by the CEST effect.

The first resonance frequency is preferably determined close to the resonance frequency of the protons that are bound to the molecules of the material to be detected, and whose resonance signals should be saturated. The second resonance frequency $f_2$ is then determined depending on the first resonance frequency $f_1$ according to the following Equation (1).

$$f_2 = 2 * f_0 - f_1 \quad (1)$$

wherein $f_0$ is the resonance frequency of water, or more precisely the resonance frequency of protons bound in water molecules.

As used herein, the phrase "close to the resonance frequency of the protons that are bound to molecules of the material to be detected" means that the magnitude of the difference between this resonance frequency of the protons that are bound to molecules of the material to be detected and the first resonance frequency is less than 1 ppm, or even better less than 0.5 ppm.

Within the scope of the present invention, a method is also provided for the acquisition of MR data within a volume segment of an examination subject with the use of a magnetic resonance system. Better information with regard to a material or substance in question is thereby obtained from the acquired MR data due to the CEST effect in the volume segment. For example, using the MR data, MR images can be created in which a defined material has been made visible by quantification of the CEST effect. The method according to the invention includes the following steps.

An RF excitation with two different resonance frequencies is radiated in order to saturate resonance signals of protons which are bound to molecules of a material to be detected with the CEST effect.

The same k-space segment is read out (filled with raw data) for respective different frequencies in order to acquire spectral information of the k-space segment. In particular, protons that have migrated from the molecules of the material to be detected to the water molecules are detected or quantified with the use of this spectral information.

The RF excitation with the two different resonance frequencies is implemented according to the method of the invention as described in the preceding for RF excitation with two resonance frequencies to detect the CEST effect.

The first-described method is concerned with how the RF excitation takes place in order to detect or to quantify the CEST effect. The second-described method is concerned with how the first-described method according to the invention is used in the acquisition of MR data.

Within the scope of the present invention, a magnetic resonance system is also provided for RF excitation with two resonance frequencies to detect the CEST effect. The magnetic resonance system has a basic field magnet, a gradient field system, at least two RF antennas or channels, a control device in order to operate the gradient field system and the at least two RF antennas to receive measurement signals acquired with the at least two RF antennas, to evaluate these measurement signals and to create MR data from the received signals. The at least two RF antennas include a first RF antenna and a second RF antenna to transmit (radiate) RF pulses. The magnetic resonance system according to the invention is designed in order to implement a first portion of the RF excitation with a first resonance frequency of the two resonance frequencies by radiation from the first RF antenna, and in order to implement a second portion of the RF excitation with a second resonance frequency of the two resonance frequencies by radiation from the second RF antenna.

The advantages of the magnetic resonance system according to the invention correspond to the advantages of the method according to the invention for RF excitation with two resonance frequencies to detect the CEST effect.

Preferably, the magnetic resonance system according to the invention has a multichannel transmission system with a first amplifier and second amplifier. The multichannel transmission system is designed so that the first amplifier activates the first RF antenna and the second amplifier activates the second RF antenna.

By the use of a multichannel transmission system (parallel transmit, pTX) with at least two channels or RF antennas, it is advantageously possible to radiate RF excitation energy at two different resonance frequencies simultaneously with the two amplifiers.

In a further embodiment, in addition to the first and second RF antennas, the magnetic resonance system according to the invention has a third RF antenna and fourth RF antenna.

Given four (or more) transmission channels (one for each of the four RF antennas), procedures known as double frequency CEST experiments with a quasi-CW radiation ("Continuous Wave") can also be conducted by always simultaneously using two RF amplifiers. It can be ensured that two of the four amplifiers are inactive while the two others transmit, so a maximum time utilization of the amplifiers of 50% can be realized.

In a preferred embodiment according to the invention, the multichannel transmission system has a third amplifier and fourth amplifier. The multichannel transmission system is designed such that the third amplifier (as well as the first amplifier) activates the first RF antenna and the fourth amplifier (as well as the second amplifier) activates the second RF antenna.

Because the first and second RF antennas are each coupled with two amplifiers, the first RF antenna can be fed by both the first and third amplifiers, and the second RF antenna can be fed by both the second and fourth amplifiers. This allows the two amplifiers coupled to each antenna to be respectively operated in alternation, so that the RF antenna coupled thereto is always fed by one of those two amplifiers, while allowing the other of those two amplifiers to temporarily be inactive. A maximum temporal utilization of the two amplifiers of 50% can best be achieved. This manner of operation allows procedures known as double frequency CEST experiments with a quasi-CW (Continuous Wave) radiation to be conducted in accordance with the present invention, despite the use of only two RF antennas.

In a further embodiment according to the invention, the multichannel transmission system has a first, a second, a third and a fourth amplifier. The first amplifier feeds the first RF antenna, the second amplifier feeds the second RF antenna, the third amplifier feeds the third RF antenna, and the fourth amplifier feeds the fourth RF antenna.

In this embodiment, the magnetic resonance system is designed such that the first amplifier activates the first RF antenna with the first resonance frequency and the second amplifier simultaneously activates the second RF antenna with the second resonance frequency during a first time interval while the third and fourth amplifiers rest. Immediately following the first time interval, the third amplifier activates the third RF antenna with the first resonance frequency and the fourth amplifier simultaneously activates the fourth RF antenna with the second resonance frequency during a second time interval while the first and second amplifiers rest. Because the first and second time intervals are repeated periodically, the RF excitation with the two resonance frequencies can take place over an arbitrarily long duration without pause, even if the maximum duration for the continuous transmission of an RF pulse is time-limited in the individual amplifier.

According to another embodiment according to the invention, the multichannel transmission system has a first amplifier and a second amplifier as well as a first frequency shifter and a second frequency shifter. The multichannel transmission system is designed such that the first amplifier activates the first RF antenna directly and the second RF antenna via the first frequency shifter while the second amplifier activates the third RF antenna directly and the fourth RF antenna via the second frequency shifter.

By the use of the first frequency shifter, the first and second RF antenna can be activated by the same (first) amplifier but the first RF antenna radiates at the first resonance frequency and the second RF antenna simultaneously radiates at the second resonance frequency. Similarly, by the use of the second frequency shifter the third and fourth RF antenna can be activated by the same (second) amplifier, but the third RF antenna radiates at the first resonance frequency and the fourth RF antenna simultaneously radiates at the second resonance frequency.

The use of at least four RF antennas or channels—of which two RF antennas alternately, respectively radiate an RF pulse with an individual resonance frequency (thus in total two RF pulses with two resonance frequencies)— advantageously leads to a lower peak pulse amplitude in comparison to a pulsed saturation given the use of only two RF antennas, so a lower SAR exposure for the examination subject results in turn during the examination. Moreover, a reliable quantification of the CEST effect and a sufficiently high signal-to-noise ratio can be achieved.

However, according to the invention it is also possible to conduct double frequency CEST experiments with quasi-CW radiation with only two RF antennas and two antennas if a frequency shifter is used. In this embodiment, the two amplifiers are coupled directly with the first RF antenna while the same two amplifiers are indirectly coupled with the second RF antenna via the frequency shifter.

When the first (or second) of the two amplifiers operates, it accordingly supplies the first RF antenna with the first resonance frequency and, due to the frequency shifter, supplies the second RF antenna with the second resonance frequency. Since only one of the two amplifiers is respectively required to supply both RF antennas at a given time, the respective other amplifier can rest, such that a quasi-CW radiation can nevertheless be realized in spite of the use of only two amplifiers and two RF antennas with only a temporal utilization of each amplifier of 50%.

The magnetic resonance system according to the invention can be designed to implement the method according to the invention. The magnetic resonance system according to the invention is thus to implement the method for RF excitation with two resonance frequencies for detection of the CEST effect, as well as the method to acquire MR data.

Furthermore, the present invention encompasses a non-transitory, computer-readable data storage medium encoded with programming instructions that, when the storage medium is loaded into a memory of a programmable control device, cause all or various embodiments of the method according to the invention as described in the preceding to be executed. The programming instructions may require components such as libraries and units to perform auxiliary functions, in order to realize the corresponding embodiments of the method. The programming instructions can be in source code (C++, for example) that must still be compiled and linked or that must only be interpreted, or in an executable software code that has only to be loaded into the corresponding computer or control device.

The electronically readable data medium can be, for example a DVD, a magnetic tape or a USB stick on which is stored electronically readable control information.

The present invention is particularly suitable for creating MR images in order to depict substances within these MR images using the CEST effect. The present invention is naturally not limited to this preferred field of application since, with the use of the present invention, other information (for example spectral information) about substances can also be detected by the CEST effect.

BRIEF DESCRIPTION OF THE DRAWINGS

FIG. 3 shows a Z-spectrum to the left, and an associated asymmetry analysis to the right.

FIG. 4 schematically shows a magnetic resonance system with two amplifiers, two frequency shifters and four RF antennas.

FIG. 5 schematically shows a magnetic resonance system with four amplifiers and two RF antennas.

FIG. 6 schematically shows a magnetic resonance system with two amplifiers, a frequency shifter and two RF antennas.

DESCRIPTION OF THE PREFERRED EMBODIMENTS

Figure 1:
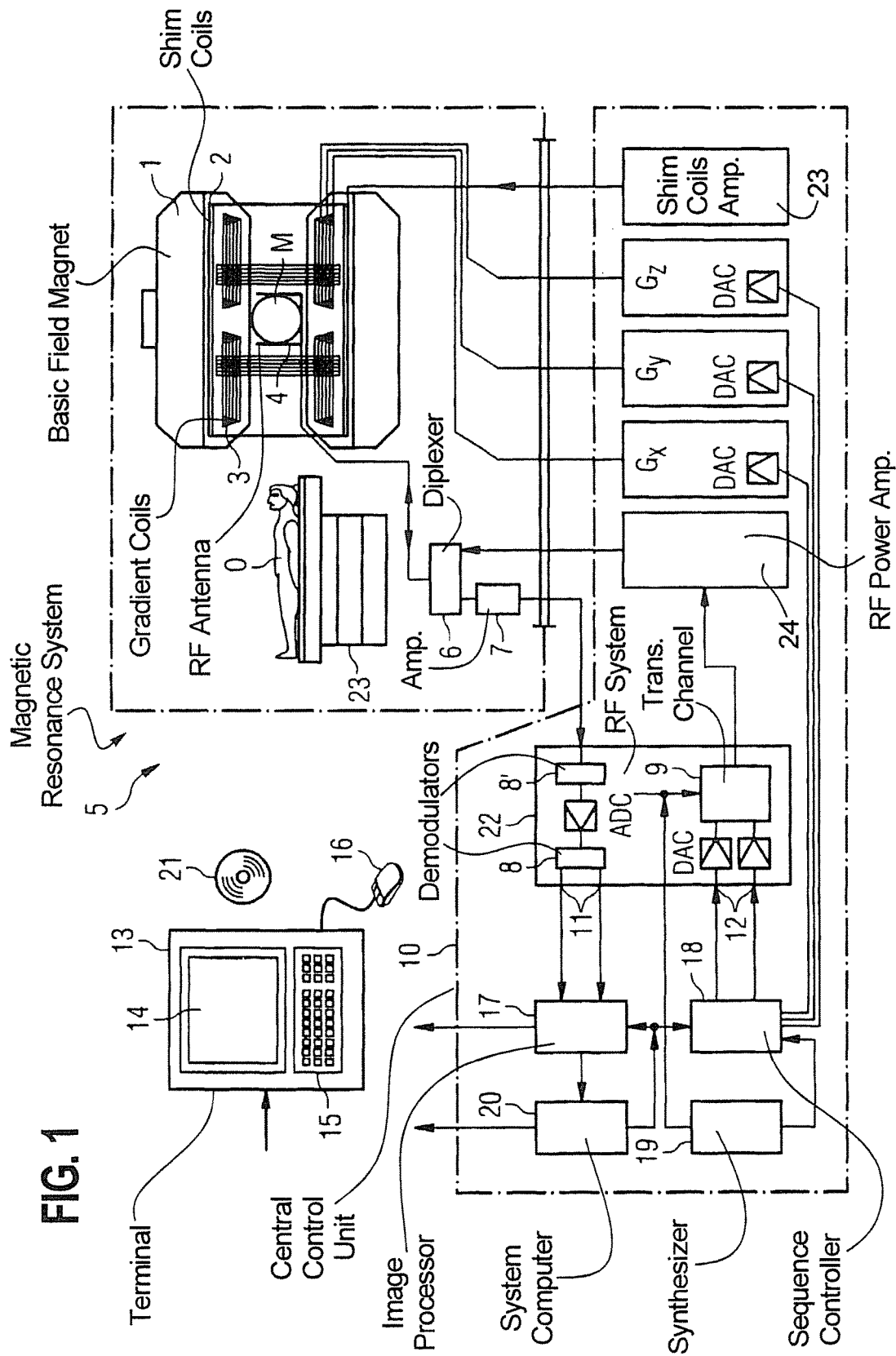
FIG. 1 depicts a magnetic resonance system according to the invention.

FIG. 1 schematically depicts a magnetic resonance system 5 (magnetic resonance tomography apparatus). A basic field magnet 1 generates a temporally constant, strong magnetic field for polarization or alignment of the nuclear spins in a volume segment of a subject O (for example of a part of a human body that is to be examined) which, lying on a table 23, is examined in the magnetic resonance system 5. The high homogeneity of the basic magnetic field that is required for the magnetic resonance measurement (data acquisition) is defined in a typically spherical measurement volume M in which the parts of the human body that are to be examined are situated. To support the homogeneity requirements, and in particular to eliminate temporally invariable influences, shim plates made of ferromagnetic material are mounted at a suitable location. Temporally variable influences are eliminated by shim coils 2 operated by a shim coils amplifier 23.

In the basic field magnet 1, a cylindrical gradient coil system 3 is used that has three sub-windings. Each sub-winding is supplied by an amplifier with current to generate a linear (also temporally variable) gradient field in a respective direction of a Cartesian coordinate system. The first sub-winding of the gradient field system 3 thereby generates a gradient $G_x$ in the x-direction, the second sub-winding generates a gradient $G_y$ in the y-direction, and the third sub-winding generates a gradient $G_z$ in the z-direction. Each amplifier includes a digital/analog converter that is controlled by a sequence controller 18 for accurately-timed generation of gradient pulses.

Situated within the gradient field system 3 are multiple radio-frequency antennas 4, 4' that each convert radio-frequency pulses emitted by a radio-frequency power amplifier 24 into an alternating magnetic field for excitation of the nuclei and deflection of the nuclear spins of the subject O to be examined, or of the region of the subject O that is to be examined. The antennas 4, 4' can also be used to detect the resulting MR signal. Each radio-frequency antenna 4, 4' is composed of one or more RF transmission coils and one or more RF reception coils in the form of an annular (preferably linear or matrix-like) arrangement of component coils. The alternating field emanating from the precessing nuclear spins (normally the nuclear spin echo signals caused by a pulse sequence composed of one or more radio-frequency pulses and one or more gradient pulses) is also converted by the RF reception coils of the respective radio-frequency antenna 4, 4' into a voltage (measurement signal), which is supplied via an amplifier 7 to a radio-frequency reception channel 8 of a radio-frequency system 22. The radio-frequency system 22 furthermore has a transmission channel 9 in which the radio-frequency pulses are generated for the excitation of magnetic resonance. The respective radio-frequency pulses are digitally represented in the sequence controller 18 as a series of complex numbers based on a pulse sequence predetermined by the system computer 20. This number sequence is supplied as a real part and imaginary part to a digital/analog converter in the radio-frequency system 22 via a respective input 12, and from the digital/analog converter to a transmission channel 9. In the transmission channel 9, the pulse sequences are modulated on a radio-frequency carrier signal whose base frequency corresponds to the center frequency.

Switching from transmission operation to reception operation takes place via a transmission/reception diplexer 6. The RF transmission coils of the radio-frequency antenna (s) 4 radiate(s) the radio-frequency pulses (resonant and non-resonant) for excitation of the nuclear spins and for generation of the B1 magnetic field into the measurement volume M, and resulting echo signals are scanned via the RF reception coil(s). The acquired magnetic resonance signals are phase-sensitively demodulated to an intermediate frequency in a reception channel 8' (first demodulator) of the radio-frequency system 22 and are digitized in an analog/digital converter (ADC). This signal is further demodulated to a frequency of 0. The demodulation to a frequency of 0, and the separation into real part and imaginary part, occur in a second demodulator 8 in the digital domain. An MR image (three-dimensional image data set) is reconstructed by an image computer 17 from the measurement data acquired in such a manner. The administration of the measurement data, the image data and the control programs takes place via the system computer 20. Based on a specification with control programs, the sequence controller 18 monitors the generation of the respective desired pulse sequences and the corresponding scanning of (entry of the acquired raw data into) k-space. In particular, the sequence controller 18 controls the time-accurate switching of the gradients, the emission of the radio-frequency pulses with defined phase amplitude and the reception of the magnetic resonance signals. The time base for the radio-frequency system 22 and the sequence controller 18 is provided by a synthesizer 19. The selection of corresponding control programs to associate the predetermined k-space lines with the echo trains and to generate an MR image (which control programs are stored on a DVD 21, for example), and the presentation of the generated MR image, take place via a terminal 13 that includes a keyboard 15, a mouse 16 and a monitor 14.

Figure 2:
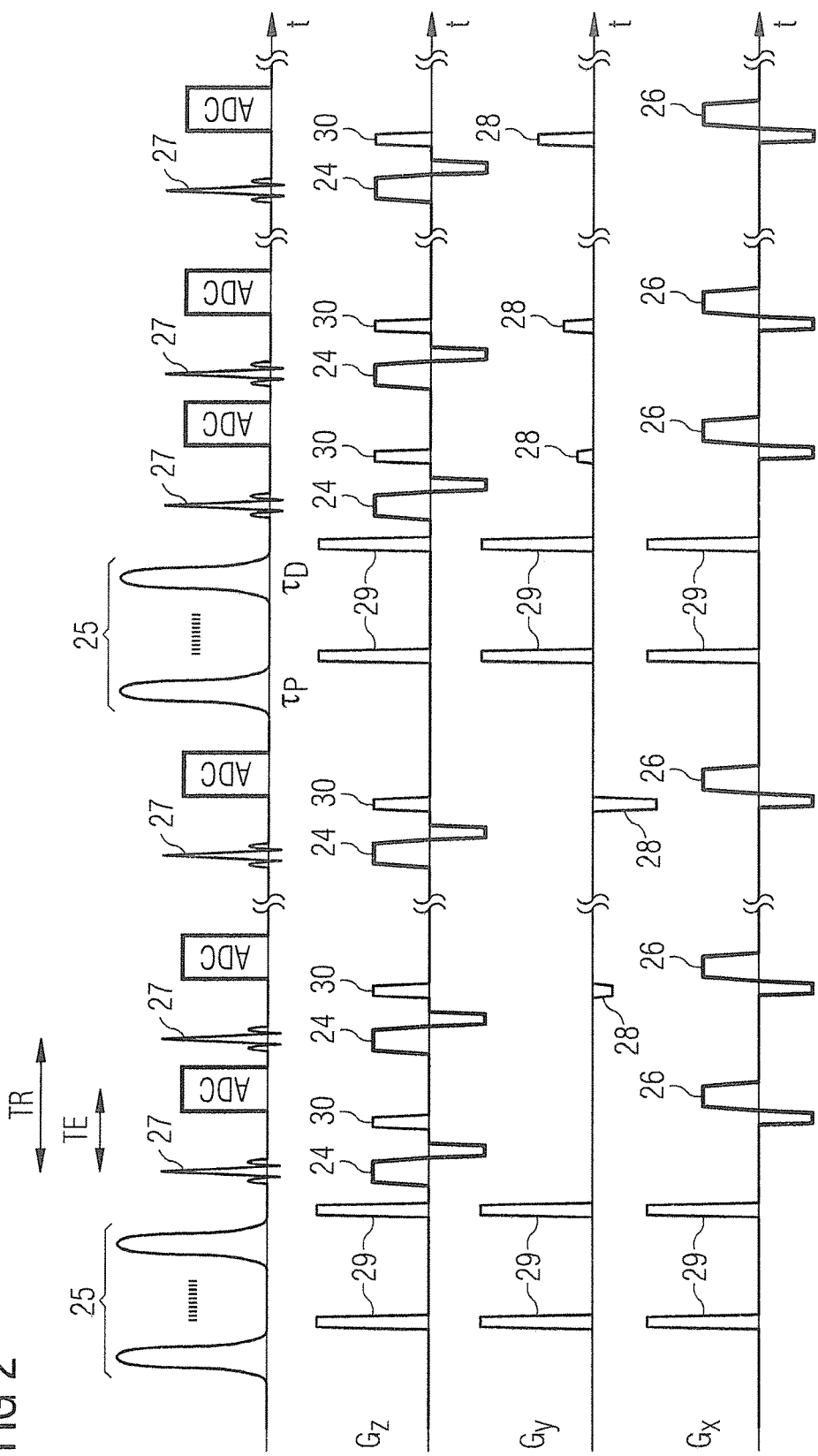
FIG. 2 shows a sequence diagram according to the invention.

A sequence diagram according to the invention is presented in FIG. 2. At the beginning of a sequence, an RF excitation 25 takes place in order to saturate the resonance signals of protons that are bound to molecules, the presence of which is to be detected and quantified. Since this detection or this quantification takes place by means of the CEST effect, the RF excitation 25 normally takes place over a duration of 1 to 3 s until a saturation equilibrium has appeared. For this reason, an RF pulse with a first resonance frequency is respectively radiated by a first RF antenna during a first half of a time period, and at the same time an RF pulse with a second resonance frequency is radiated by a second RF antenna. Immediately following, an RF pulse with the first resonance frequency is respectively radiated by a third RF antenna during a second half of the time period, and at the same time an RF pulse with the second resonance frequency is radiated by a fourth RF antenna. At the end of the first and second half of each time period, spoiler gradients 29 are activated, which are required when a time interval exists between successive saturation pulses (meaning that a quasi-CW approach is not used). Moreover, the spoiler gradients 29 are switched after the last saturation pulse before the readout ADC. In other words, in the described scenario the spoiler gradients 29 could be omitted, except for the chronologically last one.

The duration of 1 to 3 s that is required for the RF excitation 25 for detecting the CEST effect can be realized in that the time period is repeated appropriately often.

The MR data are acquired after the RF excitation or saturation 25. For this, an RF pulse 27 is radiated with a defined frequency while at the same time a slice selection gradient 24 is switched in order to excite only the spins within a slice. A spatial coding subsequently takes place via switching of a $G_y$ gradient 28, wherein at the same time a $G_z$ gradient 30 is switched which is required given a three-dimensional acquisition for phase coding in the z-direction, and is omitted given a two-dimensional acquisition. A k-space line is subsequently read out while the $G_x$ gradient 26 is being applied. Starting from one RF excitation 25, multiple k-space lines can be read out via the procedure outlined above before an additional RF excitation 25 is to be implemented for saturation.

In FIG. 2, The echo time which specifies the time period from middle of the RF pulse 27 up to the middle of the readout time period ADC is designated with the reference character TE, and the repetition time which specifies the time period from the middle of one RF pulse 27 up to the middle of the following RF pulse 27 is designated with the reference character TR.

As will be explained in more detail using FIG. 3, each k-space line is read out multiple times for different frequencies in order to detect a spectral information around the resonance frequency of water for each k-space point.

A feature known as the Z-spectrum is shown to the left in FIG. 3 for a defined voxel. In the Z-spectrum, the strength 31 of the MR measurement signal is measured as a function of the frequency F in a range around the resonance frequency $f_0$ of water. The Z-spectrum shown in FIG. 3 results if, in the RF excitation 25, the first resonance frequency $f_1$ lies 6000 Hz above the resonance frequency $f_0$ of water and the second resonance frequency $f_2$ lies 6000 Hz below the resonance frequency $f_0$ of water.

In the Z-spectrum it is apparent that the upper frequency band or saturation band (which reflects the portion of the Z-spectrum for frequencies above the resonance frequency $f_0$ of water) resembles the lower frequency band or saturation band (which reflects the portion of the Z-spectrum for frequencies below the resonance frequency $f_0$ of water), but is not identical to this. It is precisely from the difference of these two saturation bands that it can then be derived whether the CEST effect occurs in the corresponding voxel and, if yes, how strong the CEST effect is. To determine the difference of the two saturation bands, an asymmetry analysis is implemented in that the difference between the upper saturation band and the lower saturation band is calculated as is indicated by Equation (2).

$$P'(f)=P(-f)-P(f) \qquad (2)$$

wherein P(f) is the strength 31 of the measurement value at the corresponding frequency f, and P'(f) is the measurement value difference 32 for the corresponding frequency f. The difference frequency relative to the resonance frequency $f_0$ of water is thereby considered as a frequency f.

If the asymmetry analysis (shown to the right in FIG. 3) arises due to the CEST effect, P'(f) has positive values for frequencies above the cited double frequency interval and has negative values in the range below the double frequency interval. As used herein, the double frequency interval is the absolute value of the interval of the first resonance frequency $f_1$ or second resonance frequency $f_2$ from the resonance frequency $f_0$ of water. In the example shown in FIG. 3, the double frequency interval is 6000 Hz.

In the asymmetry analysis to the right in FIG. 3, it is apparent that P'(f) is positive for frequencies above 6000 Hz and is negative for frequencies below 6000 Hz, which means that the CEST effect could be detected in the corresponding voxels. The strength of the CEST effect can be determined in the slope of the curve of the asymmetry analysis in the first resonance frequency f1 and the extreme values for P'(f) in the region of the first resonance frequency (for example f1 +/−2000 Hz). Thus, the greater the strength, the greater the slope and/or the greater the absolute magnitude of the extreme values.

It follows from the previous description that, according to the invention, to detect the CEST effect and to determine the strength or quantification of the CEST effect it is sufficient to acquire the spectral information around the first resonance frequency $f_1$ and around the second resonance frequency $f_2$. For example, it is sufficient to acquire a first spectral range from $f_1-\Delta f$ to $f_1+\Delta f$, and a second spectral range from $f_2-\Delta f$ to $f_2+\Delta f$, for example in that both of these spectral ranges are scanned in frequency steps of 200 Hz.

If $\Delta f$=2000 Hz is chosen, in the example presented in FIG. 3 it is accordingly sufficient to detect the measurement values for 4000 Hz, 4200 Hz, . . . , 8000 Hz for the first spectral range and the measurement values for −8000 Hz, −7800 Hz, . . . , −4000 Hz for the second spectral range. As has been noted, the indicated frequencies are respectively differences relative to the resonance frequency $f_0$ of water, which in turn depends on the magnetic field strength.

In the presented example it is apparent that the measurement values do not need to be detected for the frequencies between −4000 Hz and 4000 Hz. This advantageously saves measurement time, whereby MR data for MR images can be acquired faster, for example. Moreover, for example, it is possible to reduce the interval of the frequency steps in order to acquire more measurement values in order to thereby reduce the signal-to-noise ratio, for example.

The selection of the double frequency interval is decisive for the detection and quantification of the CEST effect. According to the invention, the double frequency interval is selected such that the MT effect on both saturation bands occurs as similarly as possible, and that the CEST effect occurs only on one saturation band. The CEST effect can then be detected, or the strength of the CEST effect can be measured, via the asymmetry analysis. A good choice for the first resonance frequency (or one of the two resonance frequencies) is thereby the resonance frequency of protons which are bound to molecules of the material to be detected. The second (or other) resonance frequency can then be determined via Equation (1), indicated in the preceding.

A magnetic resonance system that has two amplifiers 7, 7', two frequency shifters 35, 36 and four RF transmission antennas 4, 4', 34, 34' is schematically shown in FIG. 4. The first amplifier 7 is connected directly with the first RF transmission antenna 4 and via the first frequency shifter 35 with the second RF transmission antenna 4'. Similarly, the second amplifier 7' is connected directly with the third RF transmission antenna 34 and via the second frequency shifter 36 with the fourth RF transmission antenna 34'. The two amplifiers 7, 7' are controlled via the controller 10 of the magnetic resonance system 5.

In order to now implement an RF excitation with two resonance frequencies over a time period of up to 3 s (or longer), the first amplifier 7 and the second amplifier 7' are controlled in alternation by the controller 10. The respective controlled amplifier generates an RF pulse with one of the two resonance frequencies which is then radiated via the RF transmission antenna 4, 34 connected directly with the amplifier. The resonance frequency is shifted to the respective other resonance frequency via the connection of the respective amplifier with the frequency shifter 35, 36, such that the second or, respectively, fourth RF transmission antenna 4', 34' simultaneously radiates an RF pulse with the respective other resonance frequency. In other words: either the two RF transmission antennas 4, 4' simultaneously radiate an RF pulse with the first resonance frequency and an RF pulse with the second resonance frequency, or the two RF transmission antennas 34, 34' simultaneously radiate an RF pulse with the first resonance frequency and an RF pulse with the second resonance frequency. Because the controller alternately controls the first amplifier 7 or the second amplifier 7', one of the two amplifiers can respectively rest while the respective other amplifier implements the RF excitation. It is thereby ensured that either the first and second RF transmission antenna 4, 4' or the third and fourth RF transmission antenna 34, 34' continuously radiates the RF excitation with two resonance frequencies over the predetermined time period, even if the individual amplifiers 7, 7' can only continuously operate for a fraction of the predetermined time period.

A magnetic resonance system 5 having four amplifiers 7, 7', 37, 37' and two RF transmission antennas 4, 4' is schematically depicted in FIG. 5 as a variant according to the invention. The first amplifier 7 is thereby directly connected with the first RF transmission antenna 4, and the second amplifier 7' is connected directly with the second RF transmission antenna 4'. The third amplifier 37 is additionally directly connected with the first RF transmission antenna 4 and the fourth amplifier 37' is connected directly with the second RF transmission antenna 4'. The four amplifiers 7, 7', 37, 37' are controlled via the controller 10 of the magnetic resonance system 5.

To realize an RF excitation with two resonance frequencies during a time period of 3 s, on the one hand the first amplifier 7 and the third amplifier 37 are activated in alternation by the controller 10, and on the other hand the second amplifier 7' and the fourth amplifier 37' are activated in alternation by the controller 10. The first amplifier 7 and the third amplifier 37 thereby respectively generate an RF pulse with the first resonance frequency, and the second amplifier 7' and the fourth amplifier 37' respectively generate an RF pulse with the second resonance frequency. If it is ensured that the first amplifier 7 or the third amplifier 37 always operates, the first RF transmission antenna 4 generates an RF excitation with the first resonance frequency across an arbitrary time period. If it is similarly ensured that the second amplifier 7' or the fourth 37' always operates, the second RF transmission antenna 4' also generates an RF excitation with the second resonance frequency across an arbitrary time period.

While the one of the two amplifiers connected with the same RF transmission antenna operates, the respective other amplifier can pause so that—in spite of a limited maximum duration for the continuous transmission of an RF pulse of the respective amplifier—a quasi-CW radiation can be ensured.

A magnetic resonance system 5 that has two amplifiers 7, 7', a frequency shifter 35 and two RF transmission antennas 4, 4' is schematically presented in FIG. 6 as a further variant according to the invention. The embodiment presented in FIG. 6 essentially combines the advantages of the embodiments presented with FIGS. 4 and 5. Both the first amplifier 7 and the second amplifier 7' are directly connected with the first RF transmission antenna 4. Moreover, both the first amplifier 7 and the second amplifier 7' are connected with the second RF transmission antenna 4' via the frequency shifter 35. The two amplifiers 7, 7' are controlled by the controller 10 of the magnetic resonance system 5.

In order to now implement an RF excitation with two resonance frequencies over an arbitrarily long time period (for example 3 s or longer), the first amplifier 7 or the second amplifier 7'—which respectively generate an RF pulse with the first resonance frequency—is alternately controlled by the controller. Since the output of the respective amplifier 7, 7' is connected with the same frequency shifter 35, the first resonance frequency is shifted by the frequency shifter 35 to the second resonance frequency so that an RF pulse with the second resonance frequency is fed into the input of the second RF transmission antenna 4'. Because the controller 10 alternately controls the first amplifier 7 or the second amplifier 7', the non-activated amplifier can respectively pause while the respective activated amplifier supplies both RF transmission antennas 4, 4'. In this way, a quasi-CW radiation can be provided even if each of the two amplifiers 4, 4' has a short maximum duration for a continuous transmission of an RF pulse.

Figure 7:
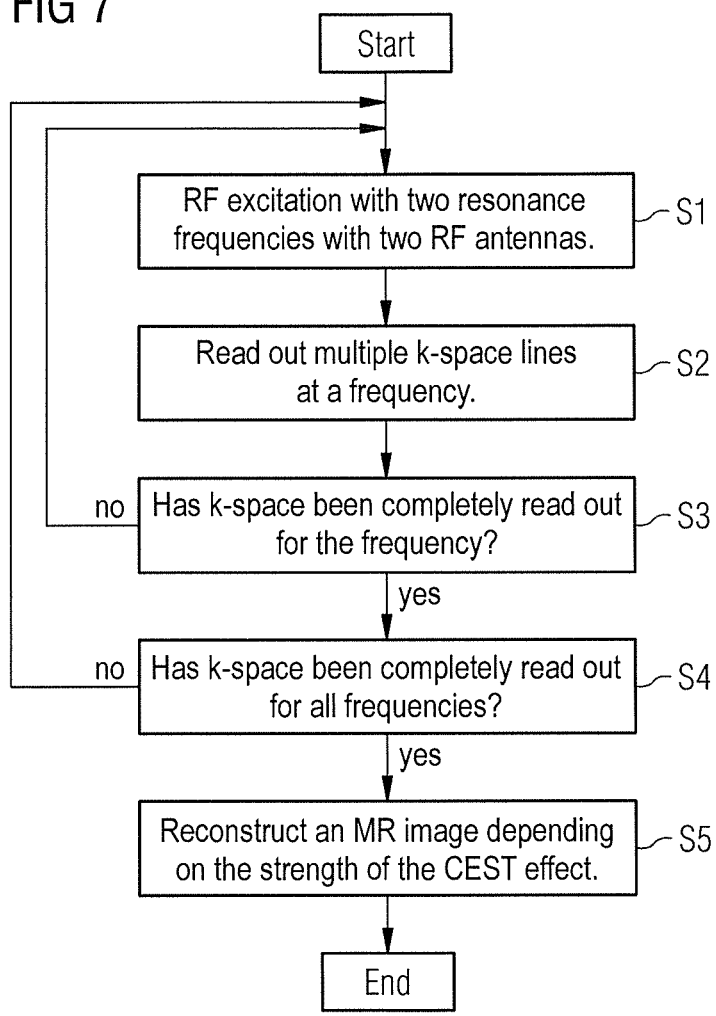
FIG. 7 is a flowchart of a method according to the invention for the acquisition of MR data.

A flowchart of important steps to implement the present invention is presented in FIG. 7.

A saturation of the resonance signals of those protons that are bound to molecules of the material to be detected takes place in a first step S1. For example, this step S1 takes 3 s so that sufficient time is present for a chemical exchange between the saturated protons and protons of water molecules, and a saturation equilibrium appears. For saturation, an RF pulse with the first resonance frequency is radiated with one RF antenna, and simultaneously an RF pulse with the second resonance frequency is radiated with a second RF antenna.

Multiple k-space lines are read out in a following second step S2, wherein measurement signals of a defined frequency are received. If, at the following query S3, k-space (or the corresponding slice of k-space) has been completely acquired for the defined frequency, the method branches to the query S4. In the other case, the saturation in Step S1 is repeated in order to receive additional measurement signals of the defined frequency for additional k-space lines in Step S2.

With the query S4 it is checked whether the region of k-space (a slice, for example) that is to be acquired has been read out for all frequencies to be acquired. If this is the case, the spectral information necessary for quantification of the CEST effect has been acquired for all k-space points to be acquired. If this is not the case, Steps S1 and S2 are repeated in order to read out additional k-space lines for a different frequency. If the query S3 is answered in the affirmative, in Step S5 an MR image is reconstructed from the completely acquired MR data in which the pixels of the MR image are depicted depending on the quantification of the CEST effect in the voxel that corresponds to the pixel. In other words: the concentration of the material to be detected with the CEST effect can be ascertained from the MR image.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for generating magnetic resonance (MR) data from which the chemical exchange saturation transfer (CEST) effect is quantified, comprising:

operating an MR data acquisition unit comprising a first radio-frequency (RF) antenna and a second RF antenna to produce an excitation of nuclear spins in an examination subject situated in the MR data acquisition unit, by producing a first portion of said excitation by operating said first RF antenna to radiate at a first frequency and by producing a second portion of said excitation by operating said second RF antenna to radiate at a second frequency, said excitation of said nuclear spins saturating resonance signals of protons that are bound to molecules of a material to be detected by the CEST effect;

operating the MR data acquisition unit to acquire MR data resulting from said excitation at both of said first and second frequencies;

repeatedly entering said MR data into an electronic memory organized as k-space, in a same k-space segment for both of said first and second frequencies, said k-space segment representing spectral information; and in a processor, operating on said spectral information to quantify protons that have migrated to water molecules from the molecules of the material to be detected by chemical exchange, and emitting an electronic signal from said processor representing a quantification of the CEST effect for said material to be detected.

2. A method as claimed in claim 1 comprising operating said MR data acquisition unit to radiate simultaneously with said first RF antenna and said second RF antenna.

3. A method as claimed in claim 1 comprising operating said MR data acquisition unit to produce said excitation by radiating an RF pulse from each of said first RF antenna and said second RF antenna, and selecting said RF pulse from the group consisting of a rectangular RF pulse, a Gaussian RF pulse, and a sinc-shaped RF pulse.

4. A method as claimed in claim 1 wherein said MR data acquisition unit comprises a third RF antenna and a fourth RF antenna, and operating said MR data acquisition unit to produce said excitation by:

during a first interval within a total duration of said first portion of said excitation, operating said first RF antenna at said first resonance frequency;

during said first interval of a total duration of said second portion of said excitation, operating said second RF antenna at said second resonance frequency;

during a second interval, which follows said first interval, of said total duration of said first portion of said excitation, operating said third RF antenna at said first resonance frequency; and during said second interval of said total duration of said second portion of said excitation, operating said fourth RF antenna at said second resonance frequency.

5. A method as claimed in claim 4 comprising operating said MR data acquisition unit with said first RF antenna and said second RF antenna inactive during each of said second interval of said first portion and said second portion of said excitation, and with said third RF antenna and said fourth RF antenna inactive during said first interval in each of said first and second portions of said excitation.

6. A method as claimed in claim 1 comprising selecting said first and second resonance frequencies depending on said material to be detected with the CEST effect.

7. A method as claimed in claim 6 comprising selecting said first resonance frequency where a resonance frequency of the protons that are bound to molecules of the material to be detected, and selecting said second frequency according to:

$$f_2 = 2 \cdot f_0 - f_1$$

wherein $f_1$ is said first resonance frequency, $f_2$ is said second resonance frequency, and $f_0$ is the resonance frequency of water.

8. A magnetic resonance (MR) apparatus for generating MR data from which the chemical exchange saturation transfer (CEST) effect is quantified, comprising:

An MR data acquisition unit comprising a first radio-frequency (RF) antenna and a second RF antenna;

a control unit configured to operate the MR data acquisition unit to produce an excitation of nuclear spins in an examination subject situated in the MR data acquisition unit, by producing a first portion of said excitation by operating said first RF antenna to radiate at a first frequency and by producing a second portion of said excitation by operating said second RF antenna to radiate at a second frequency, said excitation of said nuclear spins saturating resonance signals of protons that are bound to molecules of a material to be detected by the CEST effect;

said control unit being configured to operate the MR data acquisition unit to acquire MR data resulting from said excitation at both of said first and second frequencies;

an electronic memory organized as k-space;

said control unit being configured to repeatedly enter said MR data into said electronic memory organized as k-space, in a same k-space segment for both of said first and second frequencies, said k-space segment representing spectral information; and a processor configured to operate on said spectral information to quantify protons that have migrated to water molecules from the molecules of the material to be detected by chemical exchange, and emitting an electronic signal from said processor representing a quantification of the CEST effect for said material to be detected.

9. An MR apparatus as claimed in claim 8 comprising a multi-channel RF transmission system comprising a first amplifier and a second amplifier, said first amplifier being configured to operate said first RF antenna and said second RF amplifier being configured to operate said second RF antenna.

10. An MR apparatus as claimed in claim 9 wherein said multi-channel RF transmission system comprises a third amplifier and a fourth amplifier, said first and third amplifiers being configured to operate said first RF antenna in alternation, and said second and said fourth amplifiers being configured to operate said second RF antenna in alternation.

11. An MR apparatus as claimed in claim 8 wherein said MR data acquisition unit comprises a third RF antenna and a fourth RF antenna.

12. An MR apparatus as claimed in claim 11 wherein said MR data acquisition unit comprises a multi-channel RF transmission system comprising a first amplifier, a second amplifier, a third amplifier, and a fourth amplifier, said first amplifier being configured to operate said first RF antenna, said second amplifier being configured to operate said second RF antenna, said third amplifier being configured to operate said third RF antenna, and said fourth amplifier being configured to operate said fourth RF antenna.

13. An MR apparatus as claimed in claim 11 wherein said MR data acquisition unit comprises a multi-channel RF transmission system comprising a first amplifier, a second amplifier, a first frequency shifter, and a second frequency shifter, said first amplifier being configured to operate said first RF antenna directly, and to operate said second RF antenna via said first frequency shifter, and said second amplifier being configured to operate said third RF antenna directly, and to operate said fourth RF antenna via said second frequency shifter.

14. An MR apparatus as claimed in claim 8 wherein said MR data acquisition unit comprises a multi-channel RF transmission system comprising a first amplifier, a second amplifier, and a frequency shifter, and wherein said first amplifier and said second amplifier are configured to operate said first RF antenna directly, and to operate said second RF antenna via said frequency shifter.

15. A non-transitory, computer-readable data storage medium encoded with programming instructions, said storage medium being loaded into a computerized control and processing unit of an MR apparatus that comprises an MR data acquisition unit having a first RF antenna and a second RF antenna, said programming instructions causing said computerized control and processing unit to:
  operate the MR data acquisition unit to produce an excitation of nuclear spins in an examination subject situated in the MR data acquisition unit, by producing a first portion of said excitation by operating said first RF antenna to radiate at a first frequency and by producing a second portion of said excitation by operating said second RF antenna to radiate at a second frequency, said excitation of said nuclear spins saturating resonance signals of protons that are bound to molecules of a material to be detected by the CEST effect;
  operate the MR data acquisition unit to acquire MR data resulting from said excitation at both of said first and second frequencies;
  repeatedly enter said MR data into an electronic memory organized as k-space, in a same k-space segment for both of said first and second frequencies, said k-space segment representing spectral information; and
  operate on said spectral information to quantify protons that have migrated to water molecules from the molecules of the material to be detected by chemical exchange, and emit an electronic signal representing a quantification of the CEST effect for said material to be detected.

* * * * *